United States Patent [19]

Sakai et al.

[11] 4,152,662
[45] May 1, 1979

[54] PREAMPLIFIER HAVING INTEGRATED CIRCUITRY

[75] Inventors: Kazumasa Sakai; Hiroshi Watanuki, both of Tokyo, Japan

[73] Assignee: Trio Kabushiki Kaisha, Tokyo, Japan

[21] Appl. No.: 874,202

[22] Filed: Feb. 1, 1978

[30] Foreign Application Priority Data

Feb. 4, 1977 [JP] Japan .......................... 52-11642[U]

[51] Int. Cl.² .......................... H03F 3/45; H03F 3/04
[52] U.S. Cl. ................................ 330/252; 330/255; 330/257; 330/307
[58] Field of Search .............. 330/252, 253, 255, 257, 330/277, 307

[56] References Cited

U.S. PATENT DOCUMENTS

3,369,187  2/1968  Csicsatka .............................. 330/307

OTHER PUBLICATIONS

Ozerrov et al., "Sensitive Electrometer Amplifier Employing MOS Transistors", Instruments and Experimental Techniques, vol. 18, No. 1, Pt. 2, Jan./Feb. 1975, pp. 157-159.

Lancaster, "Linear Integrated Circuits: What's Available?", Electronics World, Nov. 1966, pp. 38-42.

*Primary Examiner*—James B. Mullins
*Attorney, Agent, or Firm*—Gerald J. Ferguson, Jr.; Joseph J. Baker

[57] ABSTRACT

In a preamplifier having integrated circuitry, the improvement where the active elements of the first stage amplification of the preamplifier and the resistor which establishes the current flowing through these active elements are mounted on the outside of the integrated circuitry and the connecting terminals for the active elements and resistor are disposed with the remaining preamplifier components inside the integrated circuitry.

7 Claims, 1 Drawing Figure

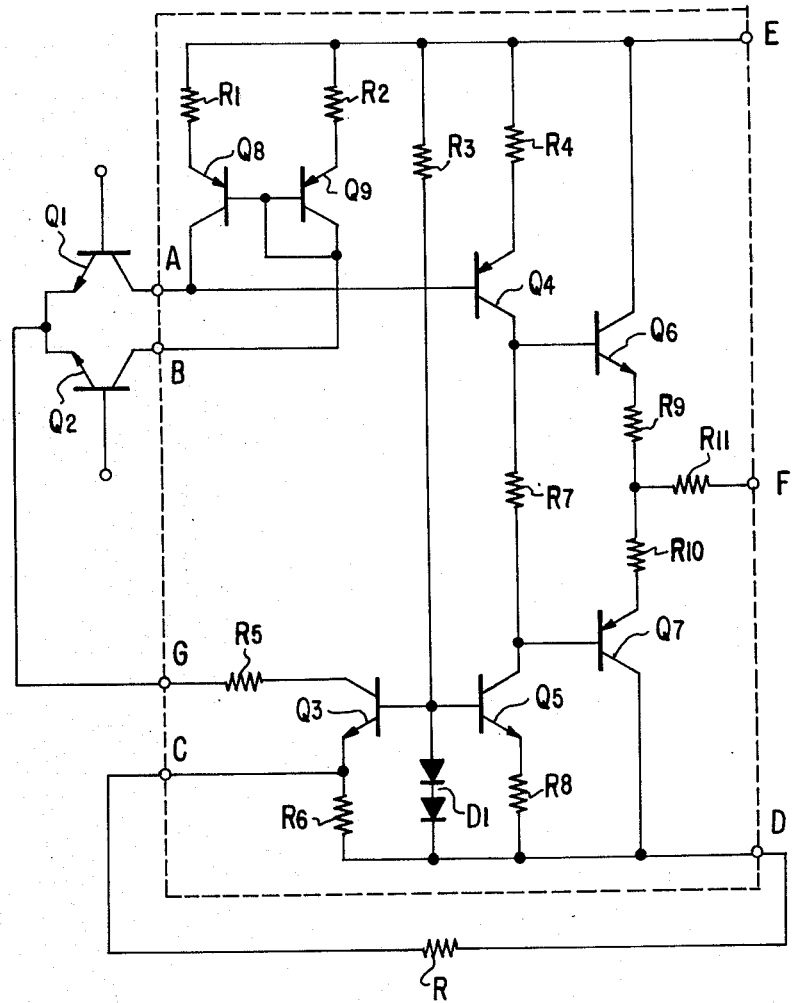

PREAMPLIFIER HAVING INTEGRATED CIRCUITRY

REFERENCE TO RELATED APPLICATION

This application is related to an application Ser. No. 874,203 entitled "An Improved Differential Amplifier With a Current Mirror Circuit" filed by the present applicants Feb. 1, 1978 and assigned to the same assignee, the related application being incorporated herein by reference.

BACKGROUND OF THE INVENTION

This invention relates to an integrated circuit for a preamplifier having a high S/N ratio and interchangeability.

Generally, the S/N of an amplifier is determined by the S/N of the first stage when the first-stage gain is sufficient. However, in order to improve the first state S/N, the resistance to being the noise signal source must be reduced. Consequently, when the impedance of the circuit is small, the noise caused by the first stage active elements causes a problem. Normally, the large noise signal source of an active element is the base spreading resistance rbb' in a transistor and the mutual conductance gm in an FET. In order to make a low-noise amplifier such as an equalizer amplifier, high hfe (current increasing rate), low rbb' transistors or high gm FETs are required as the first stage active elements.

However, it is extremely difficult to manufacture active elements such as transistors of FETs that satisfy these requirements. Furthermore, to integrate these in an integrated circuit is even more difficult. Also, when active elements, for example, transistors, are integrated in an integrated circuit, they cannot be replaced when improved transistors become available later or be replaced with FETs if desired. Thus, they also have the shortcoming of poor interchangeability.

SUMMARY OF THE INVENTION

This invention has as an object the elimination of the above-mentioned shortcomings and the provision of an integrated circuit for a preamplifier having high S/N ratio as well as interchangeability.

Other objects and advantages of this invention will be apparent from a reading of the following specification and claims taken with the drawing.

BRIEF DESCRIPTION OF THE DRAWING

The sole figure of the drawing is a circuit diagram of an illustrative embodiment of a preamplifier in accordance with the invention.

DETAILED DESCRIPTION OF PREFERRED EMBODIMENT OF THE INVENTION

In the drawing, $Q_1$ and $Q_2$ are active elements in the first stage amplification of a preamplifier. In this case, they are transistors and comprise a differential amplifier although they may be FETs or the like. R is a resistor that establishes the current flowing through transistors $Q_1$ and $Q_2$. $Q_3-Q_9$ are transistors, $R_1-R_{11}$ are resistors, and $D_1$ is a diode. These are integrated in an integrated circuit (IC) and comprise a normal preamplifier together with the above-mentioned transistors $Q_1$ and $Q_2$ and resistor R. A-G are terminals for the said IC. Of these, A, B, and G are connecting terminals for transistors $Q_1$ and $Q_2$ provided on the outside of the IC. C and D are similar connecting terminals for resistor R and D serves as a grounding terminal also. E and F are power supply and output terminals.

In other words, in this invention, the IC for the preamplifier is characterized by mounting transistors $Q_1$ and $Q_2$, which are the active elements in the first stage amplification of a preamplifier, and resistor R, which establishes the current flowing through the preamplifier, on the outside of the IC, providing the connecting terminals A-D, and G for transistors $Q_1$ and $Q_2$ and resistor R; and integrating the other preamplifier components, transistors $Q_3-Q_9$, resistors $R_1-R_{11}$, and diode $D_1$, inside. The operation of the preamplifier itself is the same as the conventional types and its explanation is omitted here.

As described above, the following effects are obtained by this invention. Since the active elements of the first stage amplification are made connectable to the IC and mounted on the outside of the IC, the type and characteristics of the active elements can be freely selected at the time of preamplifier construction. Therefore, by selecting high hfe and low rbb' transistors when the active elements are transistors $Q_1$ and $Q_2$ as shown in the drawing and high gm FET when they are FETs, a preamplifier with a high S/N is obtained opposed to when the active elements are integrated inside the IC. In addition, the resistor R for establishing the current flowing through the active elements is also connectable to the IC and mounted on the outside thereof. Thus, when improved active elements become available after the preamplifier has been assembled or when a change of active elements to a different type, for example, from transistors to FETs or vice versa, is desired, the optimum current value corresponding to each active elements can be readily set by adjusting or exchanging the resistor R.

It should be noted the circuit construction of the preamplifier, that is—the circuit construction of the first stage amplification, the circuit construction integrated in the IC or the number of IC terminals, etc. is not limited to that shown in the drawing.

What is claimed is:

1. In an amplifier having integrated circuitry, the improvement where only the active elements of the first stage amplification of the amplifier and a resistor which establishes the current flowing through these active elements are mounted on the outside of the integrated circuitry and the connecting terminals for the active elements and resistor are disposed with the remaining amplifier components inside the integrated circuitry, said amplifier including differential inputs and where said active elements consist of a pair of transistors respectively connected to said differential inputs.

2. An amplifier having integrated circuit comprising a first stage amplifying means including acitvie amplification means and resistor means for establishing the current flow through said active amplification means;

differential inputs where said active amplification means includes a pair of transistors respectively connected to said differential inputs;

further circuit means in circuit with said active amplification means and said resistor means, said further circuit means being incorporated in said integrated circuit;

said active amplification means and said resistor means being disposed outside said integrated circuit; and said further circuit means comprising a constant current transistor disposed within said integrated circuitry, said constant current transistor being in series circuit with said pair of transistors and said resistor means.

3. A preamplifier as in claim 2 where said transistors are bipolar.

4. A preamplifier as in claim 2 where said transistors have (a) control terminals respectively connected to said differential inputs, (b) input terminals connected to each other and to said resistor means and (c) output terminals connected to said further circuit means.

5. A preamplifier as in claim 2 where said constant current transistor is disposed between said pair of transistors and said resistor means.

6. An amplifier having integrated circuit comprising a first stage amplifying means including active amplification means and resistor means in series circuit with said active amplification means for establishing the current flow through said active amplification means;

further circuit means in circuit with said active amplification means and said resistor means, said further circuit means being incorporated in said integrated circuit;

said active amplification means and said resistor means being disposed outside said integrated circuit; and said integrated circuit including first, second and third terminals for connecting said active amplification means to said further circuit means and fourth and fifth terminals for connecting said resistor means to said further circuit means.

7. An amplifier as in claim 6 including differential inputs and where said active amplification means includes a pair of transistors respectively connected to said differential inputs.

* * * * *